US007651730B2

(12) United States Patent
Hasebe

(10) Patent No.: US 7,651,730 B2
(45) Date of Patent: Jan. 26, 2010

(54) METHOD AND APPARATUS FOR FORMING SILICON OXIDE FILM

(75) Inventor: Kazuhide Hasebe, Minamialps (JP)

(73) Assignee: Tokyo Electron Limited, Tokyo (JP)

( * ) Notice: Subject to any disclaimer, the term of this patent is extended or adjusted under 35 U.S.C. 154(b) by 740 days.

(21) Appl. No.: 11/180,620

(22) Filed: Jul. 14, 2005

(65) Prior Publication Data

US 2006/0032442 A1    Feb. 16, 2006

(30) Foreign Application Priority Data

Jul. 15, 2004  (JP) .............................. 2004-209048
Jun. 21, 2005  (JP) .............................. 2005-181282

(51) Int. Cl.
*C23C 16/00*  (2006.01)
*C23C 14/10*  (2006.01)
*C23C 16/40*  (2006.01)

(52) U.S. Cl. .............................. 427/248.1; 427/255.23; 427/255.27; 427/255.37

(58) Field of Classification Search ...................... None
See application file for complete search history.

(56) References Cited

U.S. PATENT DOCUMENTS 5,721,155 A *   2/1998   Lee .............................. 438/637
6,846,516 B2 *  1/2005   Yang et al. .............. 427/255.32
7,097,886 B2 *  8/2006   Moghadam et al. ......... 427/569
7,399,388 B2 *  7/2008   Moghadam et al. .... 204/192.37
2005/0181633 A1 * 8/2005   Hochberg et al. ........... 438/787

FOREIGN PATENT DOCUMENTS

| JP | 4-11730 | 1/1992 |
| JP | 8-288242 | 11/1996 |
| JP | 8-316233 | 11/1996 |
| JP | 9-246257 | 9/1997 |
| JP | 2002-9009 | 1/2002 |
| WO | WO 2005/026083 | 3/2005 |

* cited by examiner

*Primary Examiner*—Timothy Meeks
*Assistant Examiner*—Kelly M Gambetta
(74) *Attorney, Agent, or Firm*—Oblon, Spivak, McClelland, Maier & Neustadt, L.L.P.

(57) ABSTRACT

A silicon oxide film is formed on a target substrate by CVD, in a process field configured to be selectively supplied with an Si-containing gas, an oxidizing gas, and a deoxidizing gas. This method alternately includes first to fourth steps. The first step is arranged to perform supply of the Si-containing gas to the process field while stopping supply of the oxidizing and deoxidizing gases to the process field. The second step is arranged to stop supply of the Si-containing, oxidizing, and deoxidizing gases to the process field. The third step is arranged to perform supply of the oxidizing and deoxidizing gases to the process field at the same time, while stopping supply of the Si-containing gas to the process field. The fourth step is arranged to stop supply of the Si-containing, oxidizing, and deoxidizing gases to the process field.

14 Claims, 5 Drawing Sheets

METHOD AND APPARATUS FOR FORMING SILICON OXIDE FILM

CROSS-REFERENCE TO RELATED APPLICATIONS

This application is based upon and claims the benefit of priority from prior Japanese Patent Applications No. 2004-209048, filed Jul. 15, 2004; and No. 2005-181282, filed Jun. 21, 2005, the entire contents of both of which are incorporated herein by reference.

BACKGROUND OF THE INVENTION

1. Field of the Invention

The present invention relates to a method and apparatus for forming a silicon oxide film by CVD on a target substrate including a metal surface, and particularly to a film formation technique used for a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, oxidation, diffusion, reformation, annealing, and etching. In order to perform these various processes, a vertical heat processing apparatus of the batch type is known, in which a number of wafers are processed together for, e.g., a film formation process (for example, Jpn. Pat. Appln. KOKAI Publications No. 9-246257 and No. 2002-9009).

FIG. 6 is a structural view schematically showing a conventional vertical film formation apparatus (CVD apparatus). As shown in FIG. 6, the apparatus includes a vertical process container defining a process field in which target substrates or semiconductor wafers W are horizontally supported at intervals in a vertical direction. The wafers W are heated at a predetermined temperature, e.g., within a range of about 600 to 700° C., by a heater 6 disposed around the process container 2. An Si-containing gas, such as monosilane or dichlorosilane (DCS), and an oxidizing gas, such as $O_2$ or $N_2O$ gas, are supplied from below the process field by a film formation gas supply section 8. Further, the interior of the process container 2 is vacuum-exhausted by a vacuum exhaust system 12 through an exhaust port 10 formed at the top of the process container 2. The process field is thus set at a predetermined pressure and a predetermined temperature to form a silicon oxide film on the wafers W by CVD.

There is a case where the surface of a metal material (metal surface), such as a metal electrode, metal interconnection, or metal gate electrode, is exposed on a wafer W. In this case, when an oxide film, such as a silicon oxide film, is formed on the wafer, the metal surface is oxidized and thereby deteriorated as regards electric characteristics. For this reason, conventionally, in such a case, a barrier layer, such as a silicon nitride film or metal nitride film, is first formed on the metal surface. Since the metal surface is covered with the barrier layer, the metal surface is prevented from being oxidized in forming the oxide film.

Incidentally, there is a method of intermittently supplying a film formation gas into a process container to laminate oxide films of an atomic layer level or molecular layer level. Film formation methods of this kind are called ALD (Atomic Layer Deposition) or MLD (Molecular Layer Deposition). Also in ALD and MLD, where an oxide film is formed on a wafer including a metal surface, it is necessary to first cover the metal surface with a barrier layer.

As described above, according to conventional film formation methods, where a silicon oxide film is formed on a wafer including a metal surface, a barrier layer is formed in advance. Consequently, it is necessary to add a step of forming this barrier layer and thus increase the number of manufacturing steps. Further, the barrier layer is formed of a nitride film, such as a silicon nitride film, which has a high tensile stress. This stress may deteriorate some of the electric characteristics of a semiconductor device.

BRIEF SUMMARY OF THE INVENTION

An object of the present invention is to provide a film formation method and apparatus for forming a silicon oxide film on a target substrate including a metal surface, wherein the method and apparatus can prevent the metal surface from being oxidized and improve the productivity.

According to a first aspect of the present invention, there is provided a method for forming a silicon oxide film on a target substrate by CVD, in a process field configured to be selectively supplied with an Si-containing gas, an oxidizing gas, and a deoxidizing gas, the method alternately comprising:

a first step of performing supply of the Si-containing gas to the process field while stopping supply of the oxidizing gas and the deoxidizing gas to the process field;

a second step of stopping supply of the Si-containing gas, the oxidizing gas, and the deoxidizing gas to the process field;

a third step of performing supply of the oxidizing gas and the deoxidizing gas to the process field at the same time, while stopping supply of the Si-containing gas to the process field; and a fourth step of stopping supply of the Si-containing gas, the oxidizing gas, and the deoxidizing gas to the process field.

According to a second aspect of the present invention, there is provided an apparatus for forming a silicon oxide film by CVD on a target substrate including a metal surface, the apparatus comprising:

a process container having a process field configured to accommodate a target substrate;

an Si-containing gas supply circuit configured to supply an Si-containing gas to the process field;

an oxidizing gas supply circuit configured to supply an oxidizing gas to the process field;

a deoxidizing gas supply circuit configured to supply a deoxidizing gas to the process field;

a control section configured to control an operation of the apparatus, wherein, in order to form a silicon oxide film on the metal surface, the control section alternately executes a first step of performing supply of the Si-containing gas to the process field while stopping supply of the oxidizing gas and the deoxidizing gas to the process field;

a second step of stopping supply of the Si-containing gas, the oxidizing gas, and the deoxidizing gas to the process field;

a third step of performing supply of the oxidizing gas and the deoxidizing gas to the process field at the same time, while stopping supply of the Si-containing gas to the process field; and a fourth step of stopping supply of the Si-containing gas, the oxidizing gas, and the deoxidizing gas to the process field.

According to a third aspect of the present invention, there is provided a computer readable medium containing program instructions for execution on a processor, which is used for a process apparatus for forming a silicon oxide film by CVD on a target substrate including a metal surface, in a process field configured to be selectively supplied with an Si-containing gas, an oxidizing gas, and deoxidizing gas, wherein the program instructions, when executed by the processor, cause the apparatus to execute a first step of performing supply of the Si-containing gas to the process field while stopping supply of the oxidizing gas and the deoxidizing gas to the process field;

a second step of stopping supply of the Si-containing gas, the oxidizing gas, and the deoxidizing gas to the process field;

a third step of performing supply of the oxidizing gas and the deoxidizing gas to the process field at the same time, while stopping supply of the Si-containing gas to the process field; and a fourth step of stopping supply of the Si-containing gas, the oxidizing gas, and the deoxidizing gas to the process field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
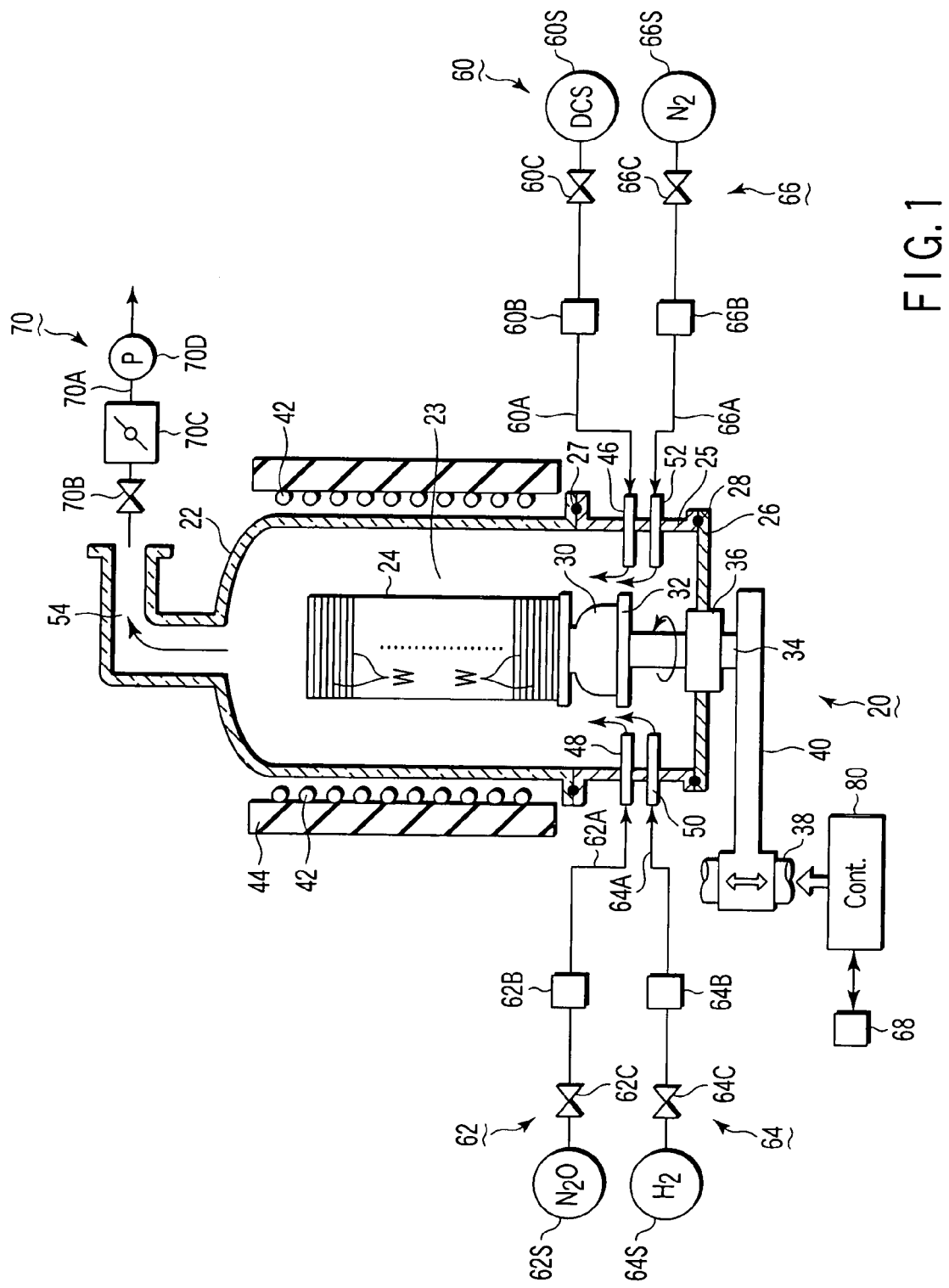
FIG. 1 is a structural view showing a vertical film formation apparatus (CVD apparatus) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a structural view showing a vertical film formation apparatus (CVD apparatus) according to an embodiment of the present invention. As shown in FIG. 1, the film formation apparatus 20 includes a vertical process container 22, which is cylindrical and opened at the bottom. The process container 22 is made of, e.g., quartz, which is high in heat resistance. An exhaust port 54 is formed at the top of the process container 22. The exhaust port 54 is connected to, e.g., an exhaust line 70A laterally bent at right angles. The exhaust line 70A is connected to a vacuum exhaust system 70 including a switching valve 70B, a pressure control valve 70C, such as a butterfly valve, and a vacuum pump 70D, provided thereon. The atmosphere within the process container 22 is vacuum-exhausted by the exhaust system 70.

The bottom of the process container 22 is supported by a cylindrical manifold 25 made of, e.g., stainless steel. A sealing member 27, such as an O-ring, is interposed between the bottom of the process container 22 and the top of the manifold 25 to keep this portion airtight. The manifold 25 has a port at the bottom, through which a wafer boat 24 is loaded and unloaded. The wafer boat 24 is made of quartz, and functions as holding means for holding semiconductor wafers W at certain intervals in the vertical direction. In this embodiment, the wafer boat 24 can support, e.g., about 50 to 100 wafers having a diameter of 300 mm at essentially regular intervals in the vertical direction. The portion corresponding to the manifold 25 may be formed of quartz integrally with the process container 22.

The wafer boat 24 is placed on a table 32 through a heat-insulating cylinder 30 made of quartz. The table 32 is supported on the top of a rotary shaft 34, which penetrates a lid 26 used for opening/closing the bottom port of the manifold 25. The portion of the lid 26 where the rotary shaft 34 penetrates is provided with, e.g., a magnetic-fluid seal 36, so that the rotary shaft 34 is rotatably supported in an airtightly sealed state. A sealing member 28, such as an O-ring, is interposed between the periphery of the lid 26 and the bottom of the manifold 25, so that the interior of the process container 22 can be kept sealed.

The rotary shaft 34 is attached at the distal end of an arm 40 supported by an elevating mechanism 38, such as a boat elevator. The elevating mechanism 38 moves the wafer boat 24 and lid 26 up and down integratedly. The table 32 may be fixed to the lid 26, so that the wafer boat 24 is not rotated in processing wafers W.

A heater 42 formed of carbon wires is disposed to surround the process container 22. The heater 42 is arranged to heat the atmosphere of a process field 23 within the process container 22, thereby heating up the semiconductor wafers W in the process field 23. The heater 42 is surrounded by a thermal insulator 40 to ensure thermal stability. The manifold 25 is connected to several gas supply circuits to supply various gases into the process container 22.

More specifically, the manifold 25 is connected to an Si-containing gas supply circuit 60, oxidizing gas supply circuit 62, deoxidizing gas supply circuit 64, and inactive gas supply circuit 66. The Si-containing gas supply circuit 60 is arranged to supply an Si-containing gas for film formation into the process container 22. The oxidizing gas supply circuit 62 is arranged to supply an oxidizing gas into the process container 22. The deoxidizing gas supply circuit 64 is arranged to supply a deoxidizing gas into the process container 22. The inactive gas supply circuit 66 is arranged to supply an inactive gas, such as nitrogen ($N_2$), into the process container 22. In this embodiment, the Si-containing gas is DCS (dichlorosilane) gas, the oxidizing gas is N2O gas, and the deoxidizing gas is H2 gas. The inactive gas may be Ar or He, in place of nitrogen.

The gas supply circuits 60, 62, 64, and 66 have gas nozzles 46, 48, 50, and 52, respectively. Each of the gas nozzles 46, 48, 50, and 52 penetrates the sidewall of the manifold 25 and has a distal end below the process field 23. The gas nozzles 46, 48, 50, and 52 are connected to gas sources 60S, 62S, 64S, and 66S through gas passages 60A, 62A, 64A, and 66A, respectively. The gas passages 60A, 62A, 64A, and 66A are provided with gas control units, each of which is formed of a flow rate controller 60B, 62B, 64B, or 66B, such as a mass flow controller, and a switching valve 60C, 62C, 64C, or 66C. The gas control units are operated by a gas supply controller 68, such as a microcomputer, to control the supply, stop, and flow rates of the gases.

The film formation apparatus 20 further includes a main control section 80 formed of, e.g., a computer, to control the entire apparatus including the gas supply controller 68. The main control section 80 can control film formation processes described later in accordance with the process recipe of the film formation processes concerning, e.g., the film thickness and composition of a film to be formed, stored in the memory thereof in advance. In the memory, the relationship between the process gas flow rates and the thickness and composition of the film is also stored as control data in advance. Accordingly, the main control section 80 can control the gas supply controller 68, exhaust system 70, elevating mechanism 38, heater 42, and so forth, based on the stored process recipe and control data.

Figure 5:
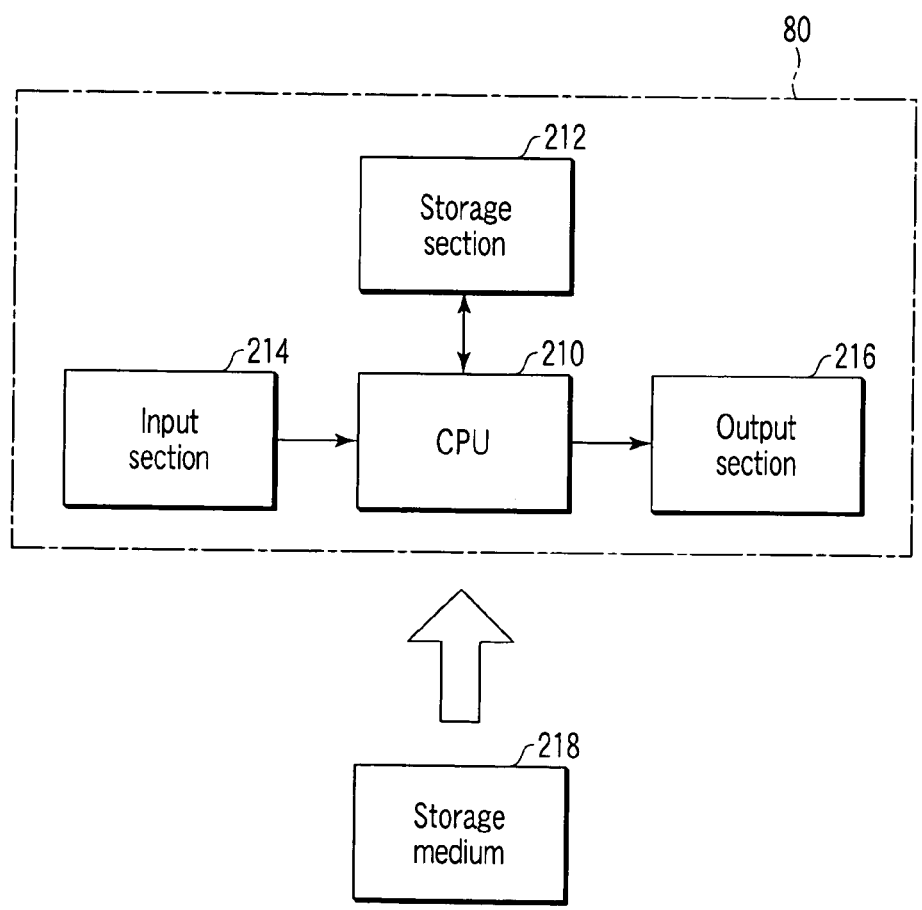
FIG. 5 is a block diagram schematically showing the structure of a main control section.
Figure 6:
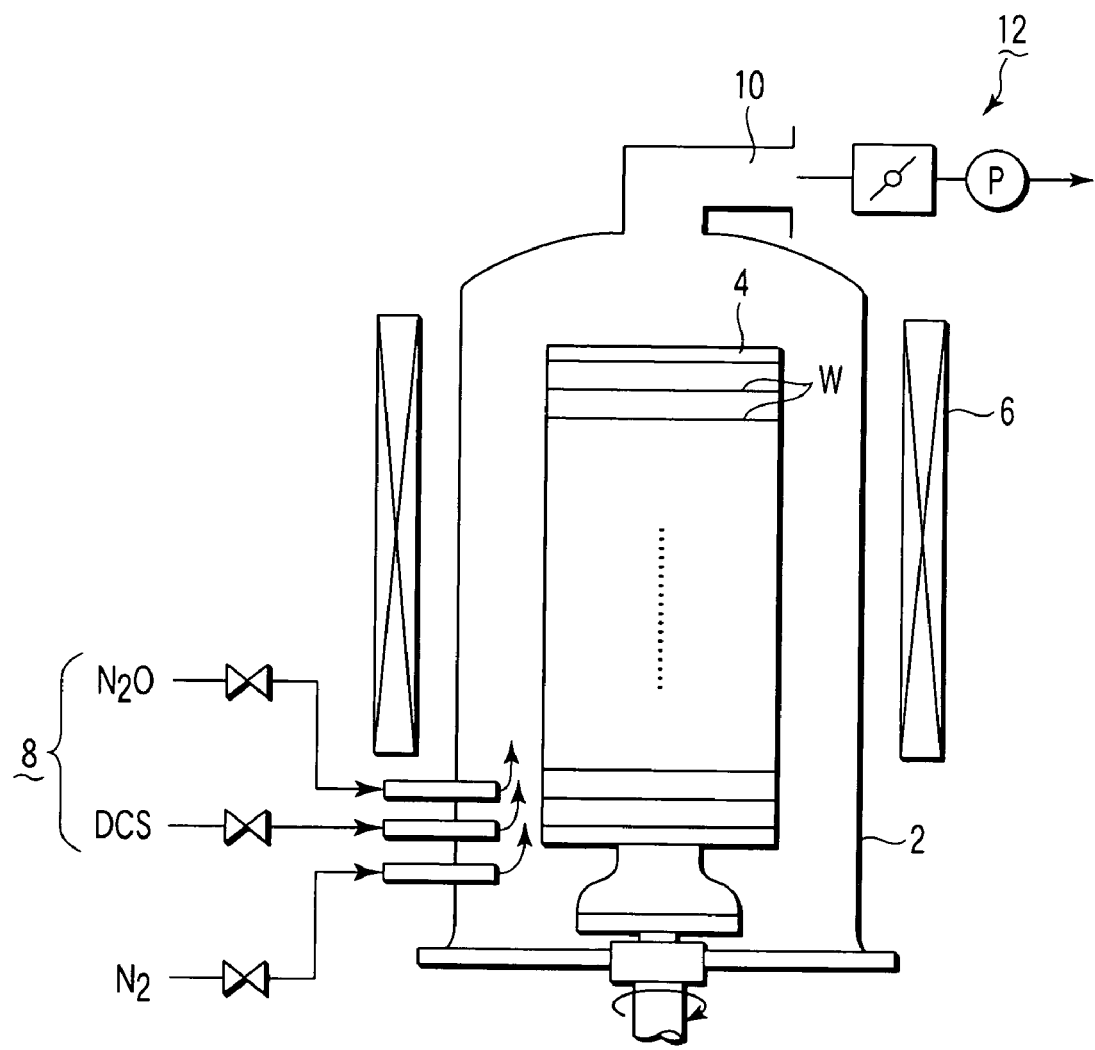
FIG. 6 is a structural view schematically showing a conventional vertical film formation apparatus (CVD apparatus).

Specifically, each of the film formation methods according to embodiments described later is performed under the control of the main control section 80 in accordance with a process program, as described above. FIG. 5 is a block diagram schematically showing the structure of the main control section 80. The main control section 80 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 5 also shows a storage medium 218 attached to the computer in a removable state.

Each of the film formation methods according to embodiments described later may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described later.

Next, an explanation will be given of a film formation method according to an embodiment of the present invention, performed in the film formation apparatus 20 described above. In this film formation method, a silicon oxide film is formed by CVD on a target substrate having an exposed metal surface, in the process field 23, which can be selectively supplied with the Si-containing gas, oxidizing gas, and deoxidizing gas. For example, the target substrate is a silicon wafer, and the metal surface is a tungsten layer surface.

At first, when the film formation apparatus 20 is in a waiting state with no wafers loaded therein, the interior of the process container 22 is kept at a temperature lower than a process temperature. On the other hand, a number of wafers W, e.g. 50 wafers, are transferred into the wafer boat 24 at a normal temperature, which is then moved up from below into the process container 22. Then, the bottom port of the manifold 25 is closed by the lid 26 to airtightly seal the interior of the process container 22.

Then, the interior of the process container 22 is vacuum-exhausted and kept at a predetermined process pressure. At the same time, the power supplied to the heater 42 is increased, so that the wafer temperature is raised and stabilized at a process temperature for film formation. Then, predetermined process gases necessary for each process step are supplied from the corresponding ones of the gas nozzles 46, 48, 50, and 52 of the gas supply circuits 60, 62, 64, and 66 at controlled flow rates, into the process container 22. As described above, the process gases are supplied intermittently (pulse-wise), while the gas supply controller 68 controls the switching valves 60C, 62C, 64C, and 66C to execute the supply and stop of the gases.

First Embodiment

Figure 2:
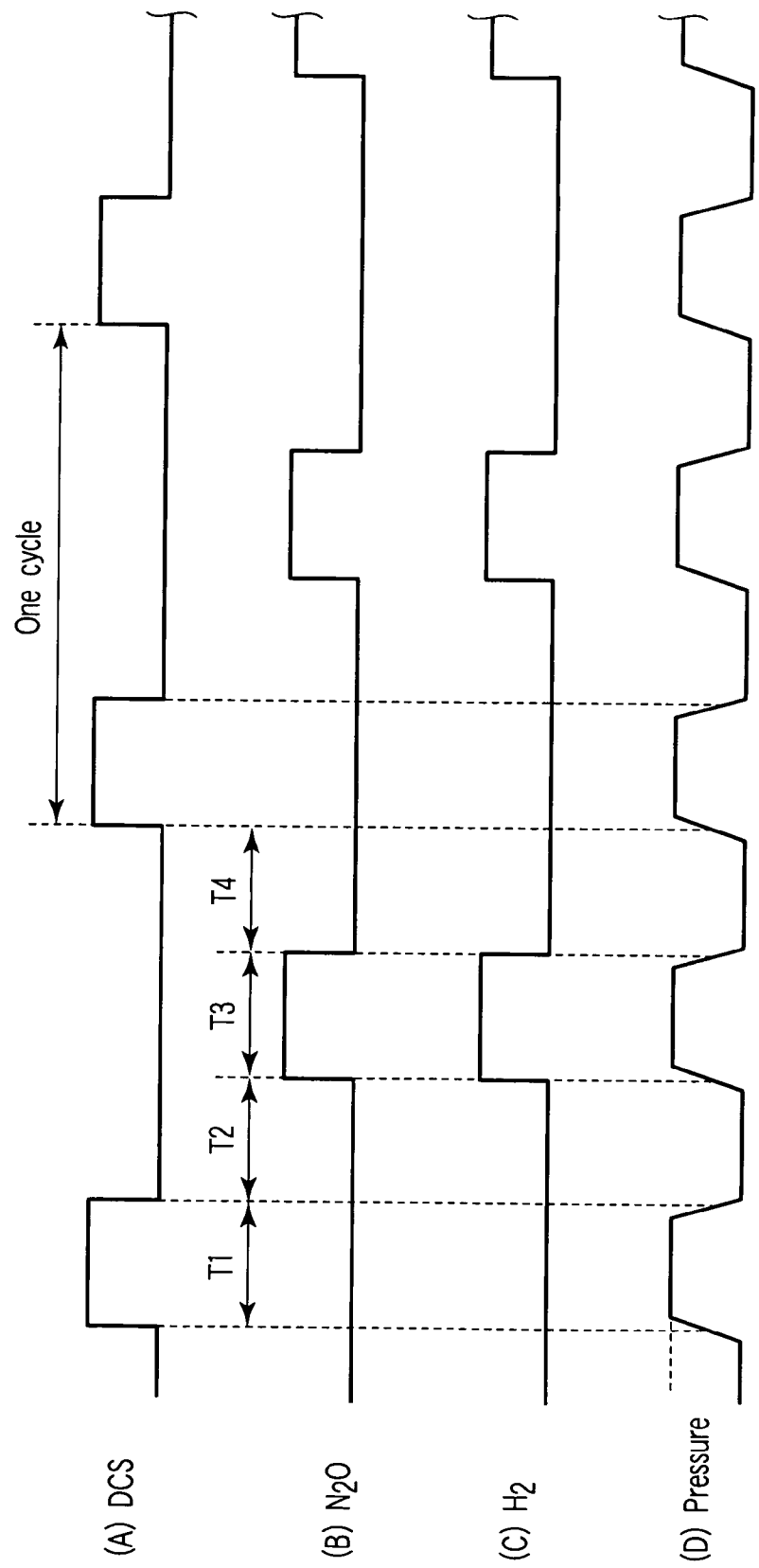
FIG. 2 is a timing chart of the gas supply of a film formation method according to a first embodiment of the present invention.

FIG. 2 is a timing chart of the gas supply of a film formation method according to a first embodiment of the present invention. As shown in FIG. 2, the film formation method according to the first embodiment is arranged to alternately repeat first to fourth steps T1 to T4. A cycle comprising the first to fourth steps T1 to T4 is repeated a number of times, and thin films of silicon oxide formed by respective cycles are laminated, thereby arriving at a silicon oxide film having a target thickness. In this embodiment, the Si-containing gas is DCS (dichlorosilane) gas, the oxidizing gas is $N_2O$ gas, and the deoxidizing gas is $H_2$ gas.

Specifically, the first step T1 is arranged to perform supply of the Si-containing gas (denoted as DCS in FIG. 2) to the process field 23, while stopping supply of the oxidizing gas (denoted as $N_2O$ in FIG. 2) and the deoxidizing gas (denoted as $H_2$ in FIG. 2) to the process field 23, (Si-containing gas supply step). The second step T2 is arranged to stop supply of the Si-containing gas, oxidizing gas, and deoxidizing gas to the process field 23. The third step T3 is arranged to perform supply of the oxidizing gas and deoxidizing gas to the process field 23 at the same time, while stopping supply of the Si-containing gas to the process field 23, (oxidizing gas and deoxidizing gas supply step). The fourth step T4 is arranged to stop supply of the Si-containing gas, oxidizing gas, and deoxidizing gas to the process field 23.

Each of the second and fourth steps T2 and T4 is used as a purge step to remove the residual gas within the process container 22. The term "purge" means removal of the residual gas within the process container 22 by vacuum-exhausting the interior of the process container 22 while supplying an inactive gas, such as $N_2$ gas, into the process container 22, or by vacuum-exhausting the interior of the process container 22 while stopping supply of all the gases. The first and third steps T1 and T3 may be arranged to stop vacuum-exhausting the process container 22 while supplying each of the process gases (Si-containing gas, oxidizing gas, and deoxidizing gas). However, where supplying each of the process gases is performed along with vacuum-exhausting the process container 22, the interior of the process container 22 can be continuously vacuum-exhausted over the entirety of the first to fourth steps T1 to T4.

In FIG. 2, the process time of each of the first to fourth steps T1 to T4 is set at, e.g., about 10 seconds. Accordingly, it takes, e.g., about 40 seconds to perform one cycle. However, the time value for each step is merely an example and thus is not limiting. The process times of the first to fourth steps T1 to T4 vary depending on the volume of the process container 22 and so forth, and, for example, each of them is preferably set to be within a range of about 1 to 160 seconds.

In the first step (Si-containing gas supply step) T1, depending on the film formation conditions, DCS gas molecules and Si atoms derived by gas decomposition are adsorbed on the surface of the wafers. In the third step (oxidizing gas and deoxidizing gas supply step) T3, oxidation of the metal surface is suppressed by the deoxidizing gas, i.e., $H_2$ gas. At the same time, DCS gas molecules and Si atoms adsorbed on the surface of the wafers are oxidized by the oxidizing gas, i.e., $N_2O$ gas. Consequently, a thin silicon oxide film ($SiO_2$ film) of an atomic layer level or molecular layer level is deposited on the wafers. The silicon oxide film formed by this film formation operation of one cycle has a thickness of, e.g., about 0.1 nm. Accordingly, where this cycle is repeated a number of times, thin silicon nitride films are laminated, thereby arriving at a silicon nitride film having a target thickness.

In the third step (oxidizing gas and deoxidizing gas supply step) T3, the flow rate of $H_2$ gas used as the deoxidizing gas is set to be higher than that of $N_2O$ gas used as the oxidizing gas, i.e., a hydrogen rich state is formed. In this state, oxidation of adsorbed Si-containing gas or Si atoms is promoted while oxidation of a metal surface is suppressed.

In the first embodiment, the flow rate of DCS gas is set at 500 sccm, the flow rate of $N_2O$ gas is set at 5 sccm, and the flow rate of $H_2$ gas is set at 1,000 sccm. In this case, the gas flow rate ratio $[N_2O/H_2]$ is 1/200. The gas flow rate ratio $[N_2O/H_2]$ is set to be within a range of about 1/1 to 2/1,000, and preferably a range of 1/10 to 1/500. If the ratio is higher than [1/1], the oxidizing gas comes to have too strong action, and thus undesirably oxidizes a metal material surface. If the ratio is lower than [2/1,000], essentially no oxide film is formed because there is insufficient oxidizing gas.

The pressure inside the process container 22 changes in the first to fourth steps T1 to T4, as shown in FIG. 2(D). For example, the pressure is about 1 Torr (133 Pa) in the first and third steps T1 and T3, and a minimal value in the second and fourth steps (purge steps) T2 and T4. In the first and third steps T1 and T3, the process pressure is set be within a range of, e.g., 13.3 Pa (0.1 Torr) to 66,500 Pa (500 Torr), and the process temperature is set be within a range of, e.g., 50 to 1,000° C. The first step T1 may be arranged such that the process conditions are set to obtain a CVD reaction domain to deposit an Si film by a CVD reaction, in place of making the DCS gas adsorbed on the wafer surface.

As described above, in the film formation method according to the first embodiment, the step of supplying the Si-containing gas to the process field 23, and the step of simultaneously supplying the oxidizing gas and deoxidizing gas to the process field 23 are intermittently and alternately performed. This makes it possible to deposit a silicon oxide film on the wafers while preventing the metal surface from being oxidized. In other words, where a silicon oxide film is formed on a wafer including a metal surface, there is no need to form a barrier layer in advance. Consequently, the number of manufacturing steps for semiconductor devices can be reduced, and semiconductor devices can be prevented from being deteriorated in electric characteristics due to a barrier layer.

After the first to fourth steps T1 to T4 are repeated a plurality of times, as described above, to form a first silicon oxide film having a predetermined thickness, the mode may be shifted to an ordinary CVD process having a high film formation rate to obtain a silicon oxide film having a final target thickness. In this case, after the first silicon oxide film is formed, a second silicon oxide film is formed by ordinary CVD while supplying an Si-containing gas and an oxidizing gas to the process field 23. The Si-containing gas and oxidizing gas used for forming the second silicon oxide film may be the same as the Si-containing gas and oxidizing gas used for forming the first silicon oxide film (although the flow rates of carrier gases may be changed).

For example, at first, the cycle of the first to fourth steps T1 to T4 is repeated 10 times to form a first silicon oxide film having a thickness of 1 nm. At this time, the process temperature is set to be within a range of about 200 to 300° C. Then, DCS gas and $N_2O$ gas are supplied to the process field 23, in accordance with an ordinary CVD, to form a second silicon oxide film having a thickness of 6 nm. At this time, the process temperature is set at a higher value within a range of about 300 to 400° C. As a result, a silicon oxide film thus formed has a final target thickness of 7 nm.

Second Embodiment

Figure 3:
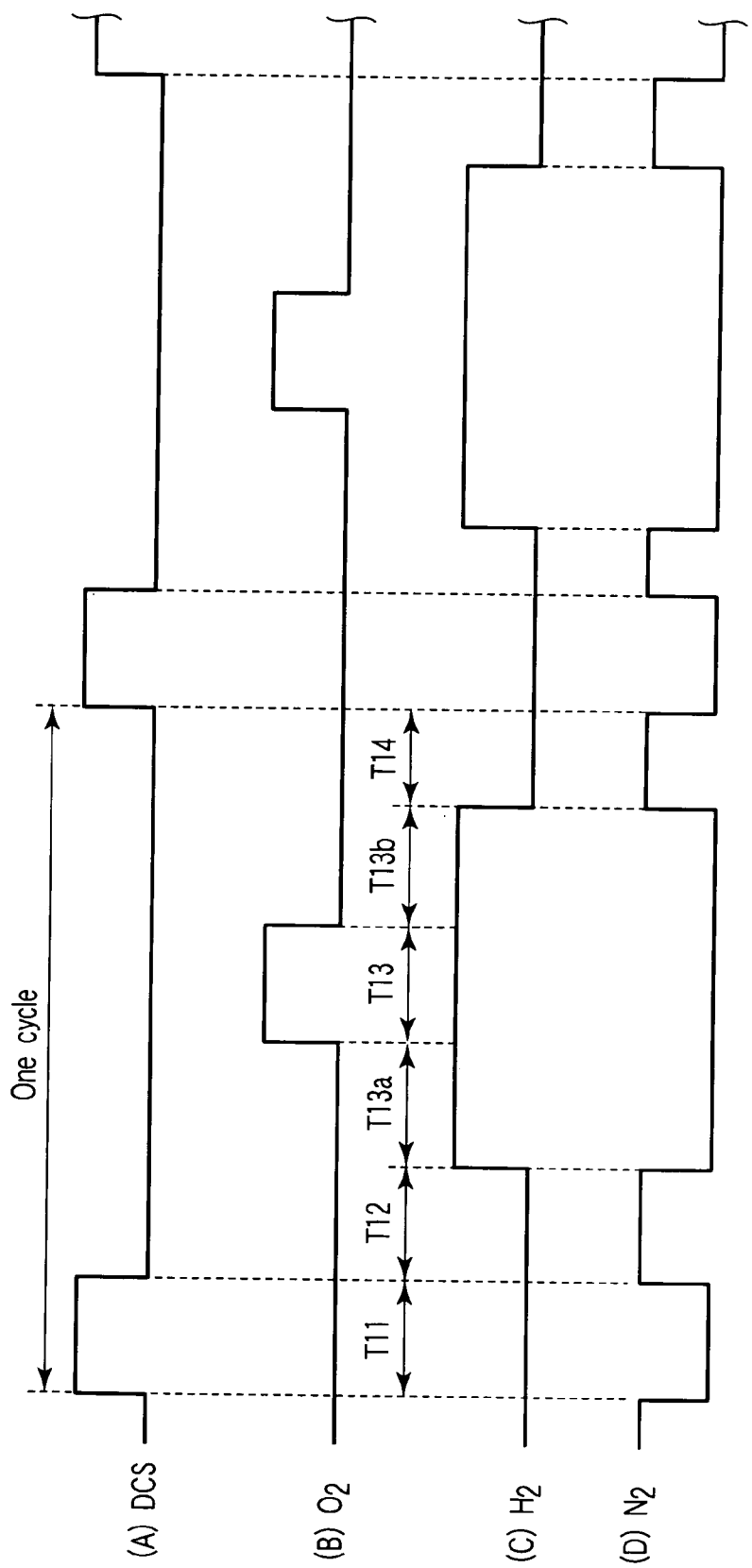
FIG. 3 is a timing chart of the gas supply of a film formation method according to a second embodiment of the present invention.

FIG. 3 is a timing chart of the gas supply of a film formation method according to a second embodiment of the present invention. As shown in FIG. 3, the film formation method according to the second embodiment is also arranged to alternately repeat first to fourth steps T11 to T14. A cycle comprising the first to fourth steps T11 to T14 is repeated a number of times, and thin films of silicon oxide formed by respective cycles are laminated, thereby arriving at a silicon oxide film having a target thickness. In this embodiment, the Si-containing gas is DCS (dichlorosilane) gas, the oxidizing gas is $O_2$ gas, and the deoxidizing gas is $H_2$ gas.

Specifically, the first step T11 is arranged to perform supply of the Si-containing gas (denoted as DCS in FIG. 3) to the process field 23, while stopping supply of the oxidizing gas (denoted as $O_2$ in FIG. 3) and the deoxidizing gas (denoted as H2 in FIG. 3) to the process field 23, (Si-containing gas supply step). The second step T12 is arranged to stop supply of the Si-containing gas, oxidizing gas, and deoxidizing gas to the process field 23, while performing supply of a purge gas (denoted as $N_2$ in FIG. 3) to the process field 23. The third step T13 is arranged to perform supply of the oxidizing gas and deoxidizing gas to the process field 23 at the same time, while stopping supply of the Si-containing gas to the process field 23, (oxidizing gas and deoxidizing gas supply step). The fourth step T14 is arranged to stop supply of the Si-containing gas, oxidizing gas, and deoxidizing gas to the process field 23, while performing supply of the purge gas to the process field 23.

Further, the film formation method according to the second embodiment includes a period of supplying only the deoxidizing gas to the process field 23 (deoxidizing gas supply step) either before or after the third step T13. Specifically, a sub-step T13a is interposed between the second and third steps T12 and T13. The sub-step T13a is arranged to perform supply of the deoxidizing gas to the process field 23, while stopping supply of the Si-containing gas and oxidizing gas to the process field 23. Further, a sub-step T13b is interposed between the third and fourth steps T13 and T14. The sub-step T13b is also arranged to perform supply of the deoxidizing gas to the process field 23, while stopping supply of the Si-containing gas and oxidizing gas to the process field 23.

As a consequence, the steps T13a, T13, and T13b proceed with the following operations. Specifically, after the second step (purge step) T12, only $H_2$ gas used as the deoxidizing gas is supplied for a predetermined period of time (the length of the sub-step T13a) to obtain a sufficient partial pressure of the deoxidizing gas. Then, supply of $O_2$ gas used as the oxidizing gas is started, thereby performing the third step T13 to simultaneously supply the oxidizing gas and deoxidizing gas. Then, only supply of $O_2$ gas is stopped, and only $H_2$ gas is supplied for a predetermined period of time (the length of the sub-step T13b). Thereafter, supply of $H_2$ gas is also stopped.

Each of the second and fourth steps T12 and T14 is used as a purge step to remove the residual gas within the process container 22. At this time, as described in the first embodiment, vacuum-exhausting the interior of the process container 22 may be performed while stopping supply of all the gases (i.e., stopping even the inactive ($N_2$ gas)), to remove the residual gas within the process container 22. The first and third steps T11 and T13 and sub-steps T13a and T13b may be arranged to stop vacuum-exhausting the process container 22 while supplying each, of the process gases (Si-containing gas, oxidizing gas, and deoxidizing gas). However, where supplying each of the process gases is performed along with vacuum-exhausting the process container 22, the interior of the process container 22 can be continuously vacuum-exhausted over the entirety of the first to fourth steps T11 to T14.

In FIG. 3, the process time of each of the first, second, and fourth steps T11, T12, and T14 is set at, e.g., about 10 seconds. Further, for example, the process time of the sub-step T13a is set to be within a range of about 1 to 100 seconds, the process time of the third step T13 is set to be within a range of about 1 to 100 seconds, and the process time of the sub-step T13b is set to be within a range of about 0 to 100 seconds. In other words, the sub-step T13b after the third step T13 may be omitted. However, the time value for each step is merely an example and thus is not limiting. The relationship in pressure among the steps in the film formation method according to the second embodiment is the same as that of the first embodiment.

As described above, the film formation method according to the second embodiment includes the sub-step (deoxidizing gas supply step) T13a immediately before the third step (oxidizing gas and deoxidizing gas supply step) T13. With this arrangement, the interior of the process field 23 is filled with a deoxidizing atmosphere, so a metal surface exposed on the wafer surface is reliably prevented from being oxidized. Consequently, a semiconductor device finally fabricated can have improved electric characteristics.

Further, the film formation method according to the second embodiment includes the sub-step (deoxidizing gas supply step) T13b immediately after the third step (oxidizing gas and deoxidizing gas supply step) T13. With this arrangement, the interior of the process field 23 is filled with a deoxidizing atmosphere, in which the silicon oxide film is subjected to annealing. Consequently, the silicon oxide film is reformed, and a semiconductor device finally fabricated can thereby have improved electric characteristics.

Common Matters to First and Second Embodiments

Figure 4:
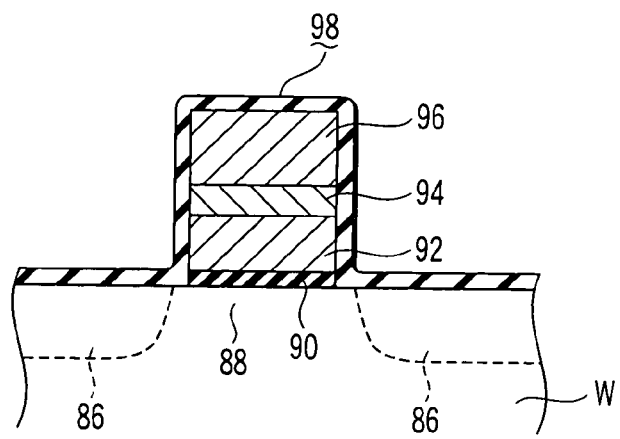
FIG. 4 is a sectional view schematically showing a gate electrode structure.

Some of the DRAMs and flash memories employ gate electrode structures in which a poly-crystalline silicon layer and a metal layer are stacked. The film formation method according to each of the first and second embodiments may be applied to such a gate electrode structure to form a sidewall. FIG. 4 is a sectional view schematically showing a structure, which may be processed by the film formation method according to each of the first and second embodiments.

As shown in FIG. 4, a pair of source/drain regions 86 are formed in the surface of a silicon wafer W. A poly-crystalline silicon layer 92 doped with phosphorus is disposed through a gate insulating film 90 on a channel region 88 between the source/drain regions 86. A tungsten nitride (WN) layer 94 and a tungsten layer 96 are further disposed on the poly-crystalline silicon layer 92. In order to form a sidewall on this gate electrode structure, a silicon oxide film 98 is deposited on the target substrate by the film formation method described above. In the case of this structure, when the silicon oxide film 98 is formed, a metal surface consisting of the surface of the tungsten layer is exposed on the target substrate.

In the first and second embodiments, the Si-containing gas comprises DCS gas, for example. In this respect, the Si-containing gas may comprise one or more gases selected from the group consisting of dichlorosilane (DCS), monosilane [$SiH_4$], desilane [$Si_2H_6$], hexachlorodisilane [$Si_2Cl_6$] (HCD), hexamethyldisilazane (HMDS), tetrachlorosilane [$SiHCl_3$] (TCS), disilylamine (DSA), trisilylamine (TSA), bistertialbutylaminosilane (BTBAS), trimethylsilane [$(CH_3)_3SiH$], trimethylsilylazide [$(CH_3)_3SiN_3$], [$SiF_4$], [$SiCl_3F$], [$SiI_4$], and [$Si_2F_6$].

In the first and second embodiments, the oxidizing gas comprises $N_2O$ gas and $O_2$ gas, respectively, for example. In this respect, the oxidizing gas may comprise one or more gases selected from the group consisting of $N_2O$, $H_2O$, $O_2$, $O_3$, $O^*$ (radical), NO, $NO_2$, $CO_2$, and CO. In this case, radicals or ozone may be generated by an ionizer or remote plasma mechanism.

In the first and second embodiments, the deoxidizing gas comprises $H_2$ gas, for example. In this respect, the deoxidizing gas may comprise one or more gases selected from the group consisting of $H_2$ and $NH_3$.

In the first and second embodiments, a metal defining a metal surface comprises tungsten, for example. In this respect, the metal surface may be a layer surface of a material selected from the group consisting of tungsten, aluminum, nickel, cobalt, copper, iron, and silicide of these metals (such as NiSi, $CoSi_2$, and $WSi_2$).

The process container 22 of the film formation apparatus is not limited to the single-tube type shown in FIG. 1, and it may be of the double-tube type. Further, in place of the batch type, the film formation apparatus may be of the single-substrate type for processing wafers one by one. A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a silicon oxide film on a metal surface present on a target substrate by CVD, in a process field configured to be selectively supplied with an Si-containing gas, an oxidizing gas, and a deoxidizing gas, the method alternately comprising:

a first step of performing supply of the Si-containing gas to the process field without performing supply of the oxidizing gas and the deoxidizing gas to the process field;

a second step of maintaining shutoff of supply of the Si-containing gas, the oxidizing gas, and the deoxidizing gas to the process field;

a third step of performing supply of the oxidizing gas and the deoxidizing gas to the process field at the same time, without performing supply of the Si-containing gas to the process field; and a fourth step of maintaining shutoff of supply of the Si-containing gas, the oxidizing gas, and the deoxidizing gas to the process field, wherein the method is arranged to form a deoxidizing gas rich state by setting a ratio of the flow rate of the oxidizing gas relative to the flow rate of the deoxidizing gas to be within a range of 1/10 to 1/500 in the third step, to start supply of the deoxidizing gas before starting supply of the oxidizing gas, to maintain supply of the deoxidizing gas while supplying the oxidizing gas, and to stop supply of the deoxidizing gas after stopping supply of the oxidizing gas so as to provide the third step with additional periods of performing supply of the deoxidizing gas to the process field without performing supply of the Si-containing gas and the oxidizing gas to the process field before and after the third step, and to repeat the first to fourth steps a plurality of times, thereby depositing a silicon oxide film on the metal surface.

2. The method according to claim 1, wherein each of the second and fourth steps comprises a period of exhausting gas inside the process field.

3. The method according to claim 2, wherein each of the second and fourth steps comprises a period of supplying a purge gas to the process field.

4. The method according to claim 2, wherein gas inside the process field is kept exhausted through the first to fourth steps.

5. The method according to claim 1, wherein the metal surface is a layer surface of a material selected from the group consisting of tungsten, aluminum, nickel, cobalt, copper, iron, and silicide of these metals.

6. The method according to claim 5, wherein the silicon oxide film is deposited on the target substrate to form a sidewall of a gate electrode structure.

7. The method according to claim 1, wherein the process field is set at a pressure within a range of 13.3 Pa (0.1 Torr) to 66,500 Pa (500 Torr) in each of the first and third steps.

8. The method according to claim 1, wherein the Si-containing gas comprises one or more gases selected from the group consisting of dichlorosilane (DCS), monosilane [$SiH_4$], desilane [$Si_2H_6$], hexachlorodisilane [$Si_2Cl_6$] (HCD), hexamethyldisilazane (HMDS), tetrachiorosilane [$SiHCl_3$] (TCS), disilylamine (DSA), trisilylamine (TSA), bistertial-butylaminosilane (BTBAS), trimethylsilane [$(CH_3)_3SiH$], trimethylsilylazide [$(CH_3)_3SiN_3$], [$SiF_4$], [$SiCl_3F$], [$SiI_4$], and [$Si_2F_6$].

9. The method according to claim 1, wherein the oxidizing gas comprises one or more gases selected from the group consisting of $N_2O$, $H_2O$, $O_2$, $O_3$, O* (radical), NO, $NO_2$, $CO_2$, and CO.

10. The method according to claim 1, wherein the deoxidizing gas comprises one or more gases selected from the group consisting of $H_2$ and $NH_3$.

11. The method according to claim 1, wherein, after the first to fourth steps are repeated said plurality of times to form a first silicon oxide film having a predetermined thickness, the method further comprises forming a second silicon oxide film on the first silicon oxide film by CVD performed at a higher temperature, while performing supply of an Si-containing gas and an oxidizing gas to the process field, the second silicon oxide film having a thickness larger than the predetermined thickness.

12. The method according to claim 11, wherein the Si-containing gas and the oxidizing gas used for forming the second silicon oxide film are the same as the Si-containing gas and the oxidizing gas used for forming the first silicon oxide film.

13. The method according to claim 1, wherein the depositing a silicon oxide film on the metal surface comprises preventing or minimizing the metal surface from oxidation by the additional periods and the deoxidizing gas rich state of the third state.

14. The method according to claim 11, wherein said forming a second silicon oxide film is arranged to supply no deoxidizing gas to the process field.

* * * * *